(12) United States Patent
Oliaei et al.

(10) Patent No.: US 11,990,917 B2
(45) Date of Patent: May 21, 2024

(54) INCREMENTAL ANALOG TO DIGITAL CONVERTER INCORPORATING NOISE SHAPING AND RESIDUAL ERROR QUANTIZATION

(71) Applicant: INVENSENSE, INC., San Jose, CA (US)

(72) Inventors: Omid Oliaei, Sunnyvale, CA (US); Stephen Bart, West Newton, MA (US)

(73) Assignee: INVENSENSE, INC., San Jose, CA (US)

( * ) Notice: Subject to any disclaimer, the term of this patent is extended or adjusted under 35 U.S.C. 154(b) by 126 days.

(21) Appl. No.: 17/805,761

(22) Filed: Jun. 7, 2022

(65) Prior Publication Data
US 2023/0396262 A1    Dec. 7, 2023

(51) Int. Cl.
*H03M 1/06* (2006.01)
*H03M 1/00* (2006.01)
(Continued)

(52) U.S. Cl.
CPC ........... *H03M 1/462* (2013.01); *H03M 1/008* (2013.01); *H03M 1/0604* (2013.01); *H03M 1/0626* (2013.01); *H03M 1/122* (2013.01)

(58) Field of Classification Search
CPC ...... H03M 3/426; H03M 3/464; H03M 1/462; H03M 3/458; H03M 1/002; H03M 3/30; H03M 1/804; H03M 1/38; H03M 3/37; H03M 3/454; H03M 3/422; H03M 1/12; H03M 1/466; H03M 1/468; H03M 3/452;
(Continued)

(56) References Cited

U.S. PATENT DOCUMENTS 8,102,292 B1 *   1/2012   Van Ess ................. H03M 3/426
                                                                   341/163
9,197,240 B1 * 11/2015   Kinyua ............... H03M 1/0626
(Continued)

OTHER PUBLICATIONS

Mazzarella et al., "Sensor Output Digitizer," U.S. Appl. No. 17/345,778, filed Jun. 11, 2021, 25 pages.
(Continued)

*Primary Examiner* — Linh V Nguyen
(74) *Attorney, Agent, or Firm* — Amin, Turocy & Watson, LLP (57) ABSTRACT

The present invention relates to an incremental analog to digital converter incorporating noise shaping and residual error quantization. In one embodiment, a circuit includes an incremental analog to digital converter, comprising a loop filter that filters an analog input signal in response to receiving a reset signal, resulting in a filtered analog input signal, and a successive approximation register (SAR) quantizer, coupled with the filtered analog input signal, that converts the filtered analog input signal to an intermediate digitized output of a first resolution based on a reference voltage, wherein the SAR quantizer comprises a feedback loop that shapes quantization noise generated by the SAR quantizer as a result of converting the filtered analog input signal; and a digital filter, coupled with the intermediate digitized output, that generates a digitized output signal of a second resolution, greater than the first resolution, by digitally filtering the intermediate digitized output.

20 Claims, 10 Drawing Sheets

(51) Int. Cl.
H03M 1/12 (2006.01)
H03M 1/46 (2006.01)

(58) Field of Classification Search
CPC .......... H03M 3/436; H03M 1/08; H03M 1/00;
H03M 1/0854; H03M 1/145; H03M 1/68;
H03M 3/368; H03M 3/428; H03M 3/412;
H03M 1/06; H03M 1/066; H03M 1/0626
USPC ........................................ 341/143, 163, 172
See application file for complete search history.

(56) References Cited

U.S. PATENT DOCUMENTS

| | | | | |
|---|---|---|---|---|
| 10,931,299 | B1* | 2/2021 | Kinyua | ................ H03K 3/0315 |
| 11,184,019 | B1 | 11/2021 | Vecera | |
| 11,626,885 | B1* | 4/2023 | Liu | ........................ H03M 3/37 |
| | | | | 341/143 |
| 2012/0112943 | A1* | 5/2012 | Lin | ........................ H03M 3/30 |
| | | | | 341/143 |
| 2016/0142072 | A1* | 5/2016 | Richter | ................ H03M 3/484 |
| | | | | 341/143 |
| 2016/0233872 | A1* | 8/2016 | Wei | ........................ H03M 3/37 |
| 2017/0346497 | A1* | 11/2017 | Durston | ................. H03M 1/08 |
| 2019/0181880 | A1* | 6/2019 | Huang | .................. H03M 3/428 |
| 2019/0238151 | A1* | 8/2019 | Wang | ..................... H03M 3/32 |
| 2019/0372581 | A1* | 12/2019 | Jang | ................... H03M 1/0854 |
| 2022/0043077 | A1* | 2/2022 | Drakshapalli | ...... G01R 33/0023 |
| 2022/0057207 | A1 | 2/2022 | Pinna et al. | |
| 2022/0345150 | A1* | 10/2022 | Modaffari | ............ H03M 3/454 |

OTHER PUBLICATIONS

Pelli, "Motion Sensor With Sigma-Delta Analog-To-Digital Converter Having Resistive Continuous-Time Digital-To-Analog Converter Feedback for Improved Bias Instability," U.S. Appl. No. 17/674,788, filed February 174, 2022, 31 pages.

Tan et al., "Incremental Delta-Sigma ADCs: A Tutorial Review," IEEE Transactions On Circuits and Systems-I: Regular Papers, vol. 67, No. 12, Dec. 2020, 13 pages.

* cited by examiner

INCREMENTAL ANALOG TO DIGITAL CONVERTER INCORPORATING NOISE SHAPING AND RESIDUAL ERROR QUANTIZATION

TECHNICAL FIELD

The subject disclosure generally relates to analog to digital conversion, and more particularly to an incremental analog to digital converter that incorporates noise shaping and residual error quantization.

BACKGROUND

Analog signals, such as those produced as output by sensor devices, can be converted to a digital format (digitized) using an analog to digital converter (ADC) to facilitate further processing by digital signal processing techniques and/or other such techniques. Presently, ADC circuits associated with sensor devices and/or other devices can be implemented on silicon chips and/or other semiconductor devices. As semiconductor technology advances, it is desirable to improve the performance of sensor devices and/or other devices that digitize analog signals by implementing ADC circuits with reduced power consumption, increased precision, reduced circuit area, and/or other improvements.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

One or more aspects of the present disclosure are generally directed toward analog to digital converters (ADCs) and corresponding methods of use. By way of example, an incremental ADC as described herein can include a successive approximation register (SAR) quantizer having a feedback loop that shapes quantization noise produced by the SAR quantizer, which in turn can improve the precision and/or resolution of an output signal produced by the ADC. By way of another example, a two-step ADC as described herein can quantize residual error produced during an initial conversion step, e.g., to further increase digitized output precision and/or resolution. In a further example, a shared ADC structure as described herein can digitize signals associated with multiple input and output channels, e.g., input and output channels associated with different sensors or other devices, according to a round robin structure and/or other suitable structures.

In one aspect disclosed herein, a circuit includes an incremental ADC, which can in turn include a loop filter that filters an analog input signal in response to receiving a reset signal, resulting in a filtered analog input signal. The incremental ADC can further include an SAR quantizer, coupled with the filtered analog input signal, that converts the filtered analog input signal to an intermediate digitized output based on a reference voltage, where the intermediate digitized output has a first resolution. The SAR quantizer can include a feedback loop that shapes quantization noise generated by the SAR quantizer as a result of converting the filtered analog input signal. The circuit can further include a digital filter, coupled with the intermediate digitized output, that generates a digitized output signal by digitally filtering the intermediate digitized output, where the digitized output signal has a second resolution that is greater than the first resolution.

In another aspect disclosed herein, a method can include, in response to receiving a reset signal, filtering, by a loop filter, an analog input signal, resulting in a filtered analog input signal; applying a reference voltage to an SAR quantizer; converting, by the SAR quantizer based on the reference voltage, the filtered analog input signal to an intermediate digital output, where the converting of the filtered analog input signal includes shaping, by a feedback loop associated with the SAR quantizer, quantization noise associated with the converting of the filtered analog input signal, and where the intermediate digital output has a first resolution; and generating, by a digital filter, a digital output signal by digitally filtering the intermediate digital output, where the digital output signal has a second resolution that is greater than the first resolution.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel features of the embodiments described will become apparent from the following description when considered in conjunction with the drawings.

Figure 1:
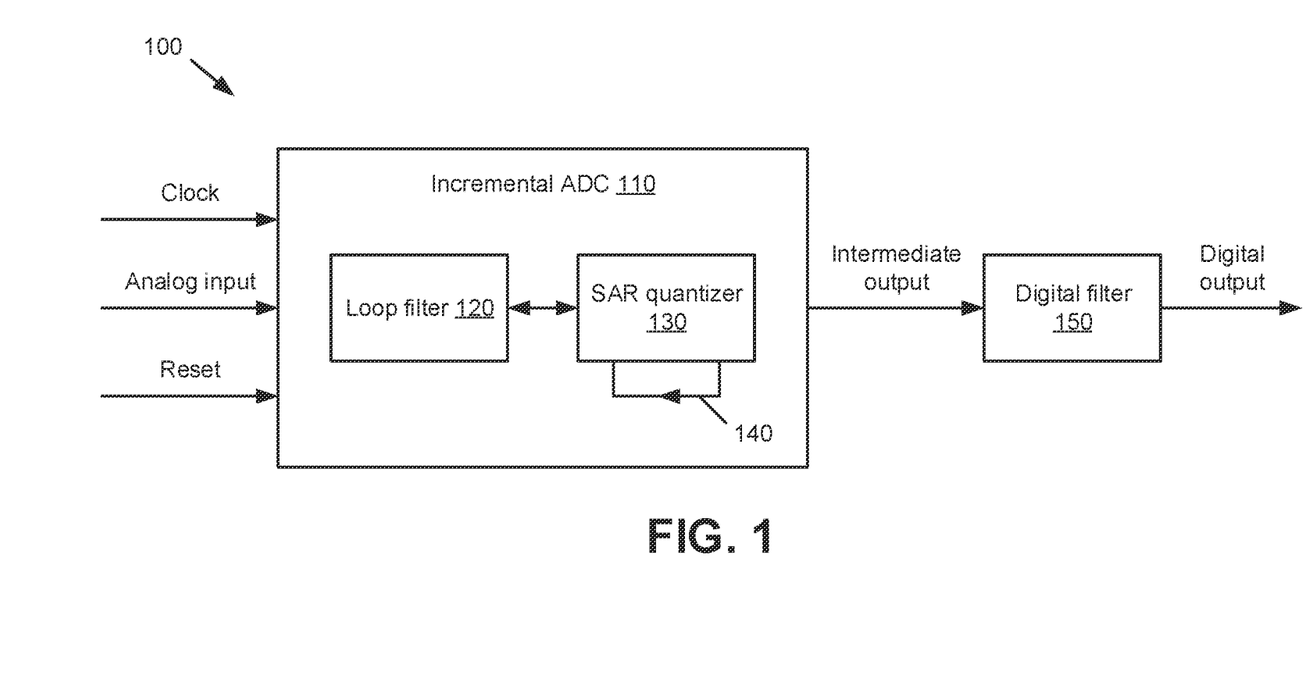
FIG. 1 is a block diagram of an analog to digital conversion circuit in accordance with various embodiments of the disclosure.

With reference now to the drawings, FIG. 1 depicts an analog to digital conversion circuit 100, also referred to herein as simply a "circuit" for brevity, in accordance with various embodiments of the disclosure. The circuit 100 shown in FIG. 1 includes an incremental ADC 110, which can accept as input an analog signal, e.g., an analog signal from a sensor or other device, and digitize the analog signal to produce an intermediate digital output signal as further described below.

The incremental ADC 110 of circuit 100 as shown in FIG. 1 incorporates a delta-sigma loop, which includes a loop filter 120 and an SAR quantizer 130 that are coupled in a closed loop configuration. While only a loop filter 120 and an SAR quantizer 130 are shown in the delta-sigma loop depicted by FIG. 1, it is noted that other components, such as a digital to analog converter (DAC) or the like, could also be connected in the delta-sigma loop, e.g., as will be described in further detail below with respect to FIG. 3. As further shown in FIG. 1, clock and reset inputs are provided to the incremental ADC 110 to control the operation of the loop filter 120, the SAR quantizer 130, and/or other elements of the incremental ADC 110, as will be described below.

The loop filter 120 of the incremental ADC 110 can, in response to receiving a reset signal (e.g., a reset pulse), filter an analog input signal provided as input to the incremental ADC 110 and provide the resultant filtered analog input signal to the SAR quantizer 130. By filtering an analog input signal prior to processing by the SAR quantizer 130, an output resolution of the incremental ADC 110 can be increased at the cost of an increase in processing time associated with operation of the loop filter 120.

The loop filter 120 can incorporate any structure and/or functionality suitable for filtering an incoming analog input signal. In various embodiments, the loop filter 120 can include, or implement the functionality of, a resistor-capacitor network, a switched capacitor, a continuous time structure using integrators or resonators, or the like. Other structures are also possible.

The SAR quantizer 130 of the incremental ADC 110 can convert a filtered analog signal processed by the loop filter 120 into an intermediate digitized output based on a reference voltage applied to the SAR quantizer 130. In an embodiment, the SAR quantizer 130 can process an incoming analog signal over a given number of cycles of the clock signal, e.g., such that the SAR quantizer generates one or more bits of the intermediate digitized output per clock cycle. As further shown in FIG. 1, the SAR quantizer 130 includes a feedback loop 140 that increases the precision of the SAR quantizer 130 by shaping quantization noise produced by the SAR quantizer 130 during conversion of an analog signal.

As additionally shown by FIG. 1, the intermediate output produced by the incremental ADC 110 can be coupled to a digital filter 150, which can generate a digitized (digital) output corresponding to the analog input provided to the incremental ADC 110 by digitally filtering the intermediate output. In an embodiment, the digital filter 150 can reduce quantization noise associated with the intermediate output by, e.g., performing averaging of a digital sequence generated by the incremental ADC 110. This averaging can be performed over a series of iterations, which can further reduce quantization noise produced by the incremental ADC 110 as well as increasing the precision or resolution of the resultant output signal, e.g., from a first resolution associated with the intermediate output to a second, greater resolution.

Figure 2:
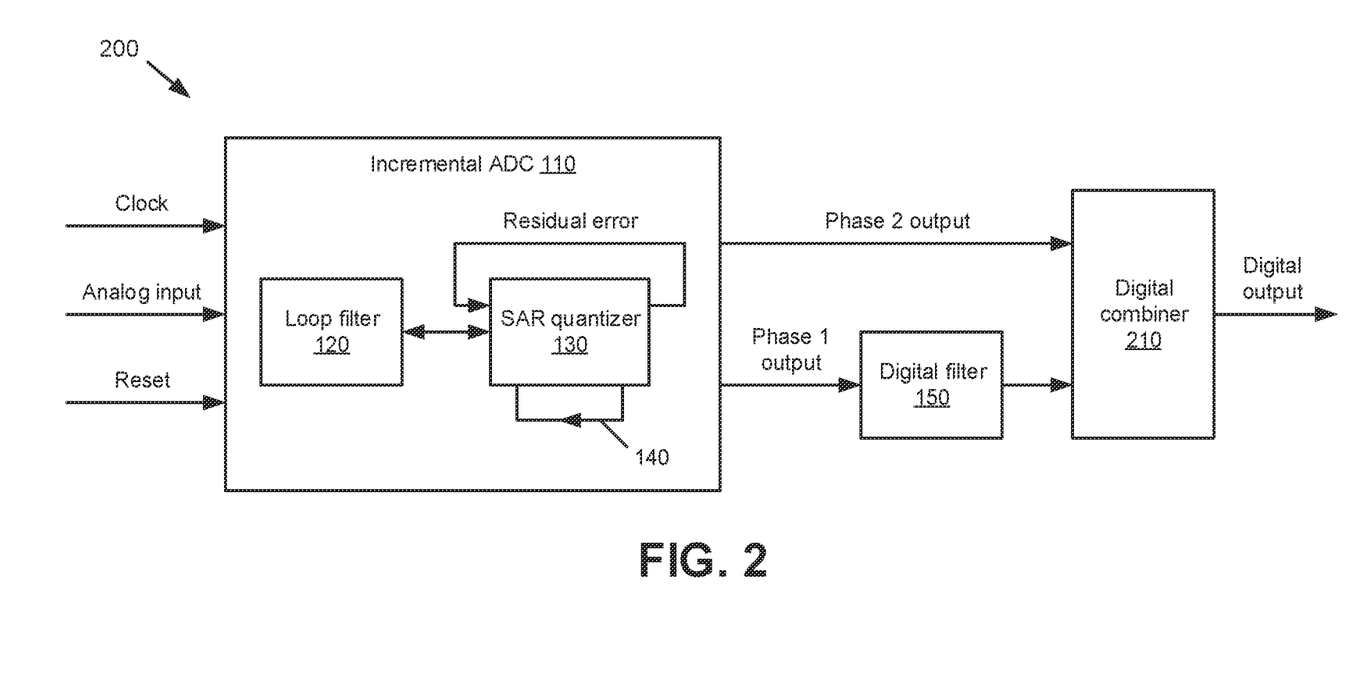
FIG. 2 is a block diagram depicting the analog to digital conversion circuit of FIG. 1 in a two-phase configuration in accordance with various embodiments of the disclosure.

Turning next to FIG. 2, a two-phase analog to digital conversion circuit 200, also referred to herein as simply a "circuit" for brevity, is illustrated. Repetitive description of like elements employed in other embodiments described herein is omitted for sake of brevity. Circuit 200 as shown by FIG. 2 includes an incremental ADC 110, which can utilize a loop filter 120 and an SAR quantizer 130 with a feedback loop 140 to convert an analog input signal to a first intermediate digital output in a first conversion phase, e.g., in a manner similar to that described above with respect to FIG. 1.

As additionally shown by FIG. 2, the SAR quantizer 130 of the incremental ADC 110 can additionally perform a second conversion phase by processing a residual error signal produced during the first conversion phase, resulting in a second intermediate output. In an embodiment, the residual error can be determined based on a difference between the initial analog input signal and an analog representation of the first intermediate output, e.g., as will be described in further detail below with respect to FIG. 3.

As further shown by FIG. 2, the first intermediate output produced by the incremental ADC 110 can be filtered using a digital filter 150, e.g., as described above with respect to FIG. 1. The resultant digitized output signal and the second intermediate output of the incremental ADC 110 can then be summed and/or otherwise combined using a digital signal combiner 210, resulting in a combined digital output signal corresponding to the analog input signal provided to the incremental ADC 110.

Figure 3:
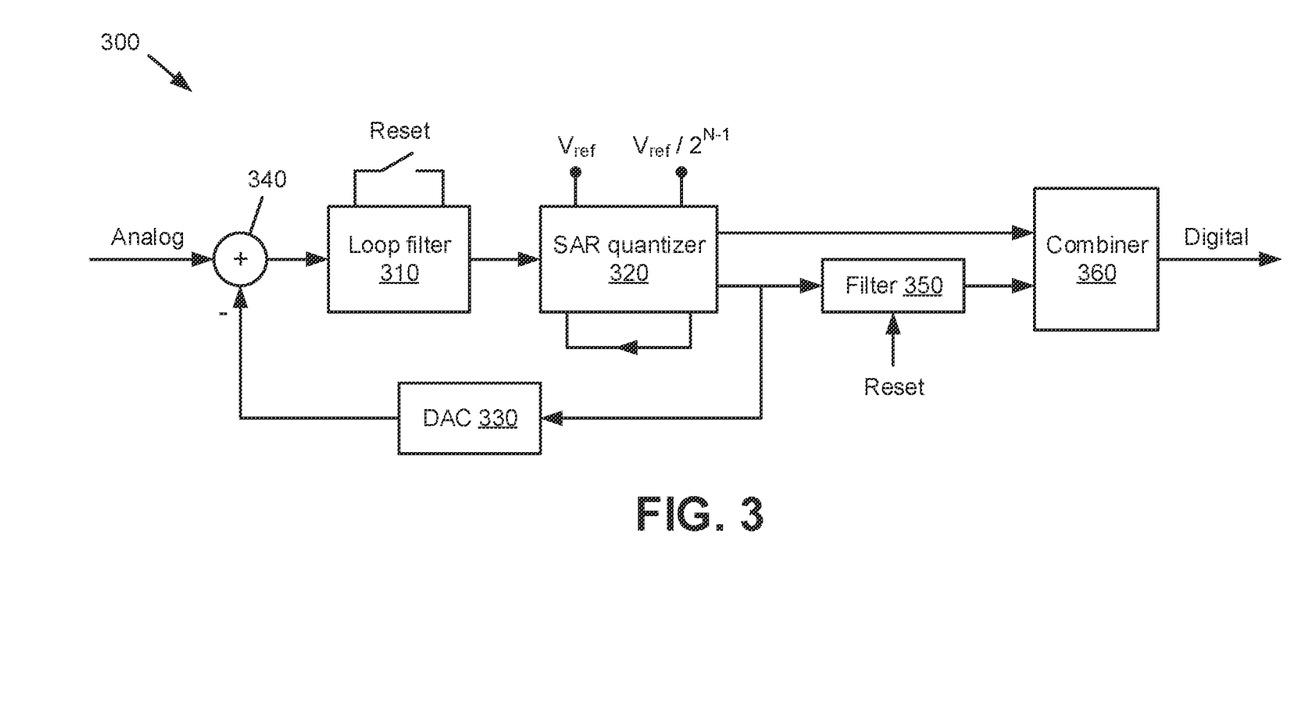
FIG. 3 is a schematic diagram of an analog to digital conversion circuit with noise shaping and residual error quantization in accordance with various embodiments of the disclosure.

Referring now to FIG. 3, a schematic diagram of an analog to digital conversion circuit 300, also referred to herein as simply a "circuit," with noise shaping and residual error quantization is provided. Circuit 300 as shown in FIG. 3 represents a more detailed view of a circuit that can perform two-phase analog to digital conversion as described above with respect to FIG. 2. It is noted, however, that circuit 300 represents merely one implementation that could be utilized to facilitate the functionality of circuit 200, and that other implementations are also possible.

Circuit 300 as shown in FIG. 3 includes a loop filter 310, an SAR quantizer 320, a digital to analog converter (DAC) 330, and a differential amplifier 340 that are electrically coupled in a closed loop configuration, forming a sigma-delta modulator. In an embodiment, this sigma-delta modulator can operate according to a two-step process to digitize an analog input signal with improved resolution. In the first processing step, the loop filter 310 and the SAR quantizer 320 can operate together to quantize an incoming analog input signal, e.g., as described above with respect to FIGS. 1-2. In the first step, the SAR quantizer 320 performs initial digitization of the analog input based on a first reference voltage $V_{ref}$. During the first processing step, noise shaping is performed both by a feedback loop at the SAR quantizer 320 as well as a second loop through the DAC 330. As a result of the first processing step, the SAR quantizer 320 produces an intermediate output signal, which is filtered using a digital filter 350, e.g., as described above. An example structure that can be utilized by the SAR quantizer 320 for the first and/or subsequent processing steps is described in further detail below with respect to FIG. 9.

Subsequently, residual quantization error associated with the first quantization step can be obtained, e.g., by converting the intermediate digital output produced by the SAR quantizer 320 in the first processing step back to an analog format via the DAC 330 and subtracting the converted analog signal from the original analog input via the differential amplifier 340. This resulting residual analog signal can then be processed again by the SAR quantizer 320 in a second processing step according to a second reference voltage that is lower than the first reference voltage, here represented by $V_{ref}/2^{N-1}$ for an integer value N, to obtain a second intermediate digitized output. The second intermediate digitized output can then be combined with the output of the first processing step, e.g., the filtered intermediate output produced by the digital filter 350 after the first processing step, by a combiner 360, resulting in a final digitized output. In an embodiment, N can represent a number of clock cycles associated with the first processing step and/or a number of digital bits produced by the SAR quantizer 320 during the first processing step, as will be described below with respect to FIG. 4.

By utilizing two steps of quantization in addition to an SAR quantizer 320 with noise shaping, e.g., via a feedback loop as well as within the sigma-delta loop described above, circuit 300 can produce a digitized output signal with a higher resolution than the resolution of the SAR quantizer 320. By way of an example in which the SAR quantizer 320 has a resolution of 4-5 bits, digitally filtering an intermediate output sequence of the SAR quantizer 320 in the first processing step via the digital filter 350 can result in a resolution of the first intermediate output being increased from the 4-5 bit resolution of the SAR quantizer 320 to a larger resolution, e.g., 10-12 bits. This filtered intermediate output can then be combined at the combiner 360 with a second intermediate output sequence produced by the SAR quantizer 320 during the second processing step, resulting in a final digital output with a resolution equal to the combined resolution of the two intermediate outputs, e.g., approximately 14-16 bits.

Figure 4:
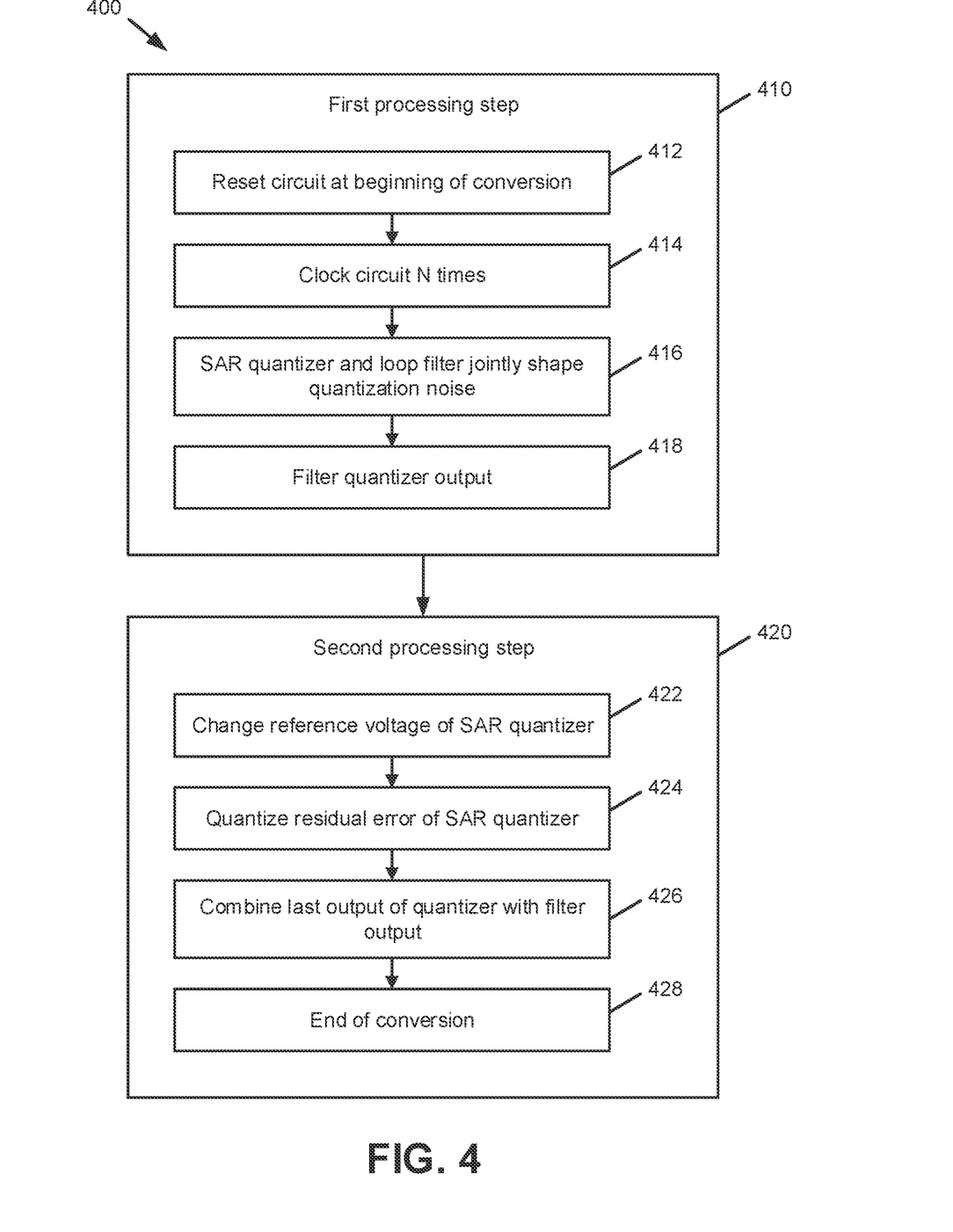
FIG. 4 is a flow diagram depicting processing steps performed by the analog to digital conversion circuit of FIG. 3 in accordance with various embodiments of the disclosure.

Turning now to FIG. 4, and with further reference to FIG. 3, a flow diagram of a method 400 that can be utilized by circuit 300 for digitizing an analog input signal is shown with reference to two processing steps 410, 420. While each of the processing steps 410, 420 shown in method 400 each include respective operations, it is noted that the labeling and designation of processing steps 410, 420 are meant merely for purposes of illustration and ease of explanation and are not intended to limit, either explicitly or implicitly, the depicted operations to any specific temporal or other relationships. For example, it is noted that other groupings and/or orders of the operations shown in method 400 could also be used without departing from the scope of this description.

The first processing step 410 shown in method 400 begins at 412, in which the circuit 300 is reset at the beginning of conversion of a given analog signal, e.g., by sending a reset pulse to the loop filter 310 and/or the digital filter 350. Next, at 414, the circuit 300 is clocked N times for an integer N, e.g., by running the circuit 300 for a length of time corresponding to N clock cycles. During clocking of the circuit 300 as shown at 414, the first processing step 410 can also proceed to 416, in which the SAR quantizer 320 and the loop filter 310 can jointly shape quantization noise associated with conversion of an analog signal.

In an embodiment, the SAR quantizer 320 can perform quantization of the analog input signal according to a reference voltage, e.g., $V_{ref}$ as shown in FIG. 3, at 414 and/or 416. In one example, the number N of clock cycles for which the circuit 300 is clocked at 414 can be equal to the resolution of the SAR quantizer 320, e.g., such that the SAR quantizer 320 performs one bit of quantization per clock cycle. In such an example, the DAC 330 and the differential amplifier 340 can be used to adjust the analog input signal between clock cycles to account for quantization already performed by the SAR quantizer 320.

As a result of the quantization performed by the SAR quantizer 320 during the first processing step 410, the SAR quantizer 320 produces a series of digital bits corresponding to the analog input signal. At 418, the first processing step 410 can conclude by filtering the output of the SAR quantizer 320, e.g., via the digital filter 350.

Following filtering of the quantizer output at 418, method 400 can proceed to the second processing step 420. The second processing step 420 begins at 422, in which the reference voltage of the SAR quantizer 320 is changed (lowered). In an embodiment, the reference voltage of the SAR quantizer 320 is lowered at 422 by an amount based on the number N of clock cycles for which the circuit was clocked at 414, e.g., from an initial value $V_{ref}$ to a new value $V_{ref}/2^{N-1}$ and/or another suitable value that is based on the number N of clock cycles.

Subsequently, the second processing step proceeds to 424, in which the SAR quantizer 320 quantizes the residual error associated with the first processing step 410, e.g., as represented by the difference between the original analog input signal and a converted analog signal, generated by the DAC 330, corresponding to the quantized output produced by the SAR quantizer 320 during the first processing step 410. As shown in FIG. 3, this difference can be performed by subtracting the output of the DAC 330 from the original analog input signal via the differential amplifier 340. By reducing the reference voltage used by the SAR quantizer 320 at 422 combined with quantizing the residual error associated with the first processing step 410 at 424, the SAR quantizer 320 can generate additional digital bits associated with an analog input signal with higher resolution as compared to a single-phase technique, resulting in improved precision of the resulting digital output. In an embodiment, quantization as shown at 424 can be performed exclusively by the SAR quantizer 320, e.g., without utilizing the loop filter 310. A functional model illustrating the operation of the SAR quantizer 320 in the first processing step 410 and the second processing step 420 in further detail is described below with respect to FIG. 5.

At 426, the filtered quantizer output generated by the digital filter 350 at 418 is combined with the output of the SAR quantizer 320 at 424, e.g., via a combiner 360. At 428, the output of the combiner 360 can be provided as a final digital output corresponding to the initial analog input, and the conversion process can conclude.

Figure 5:
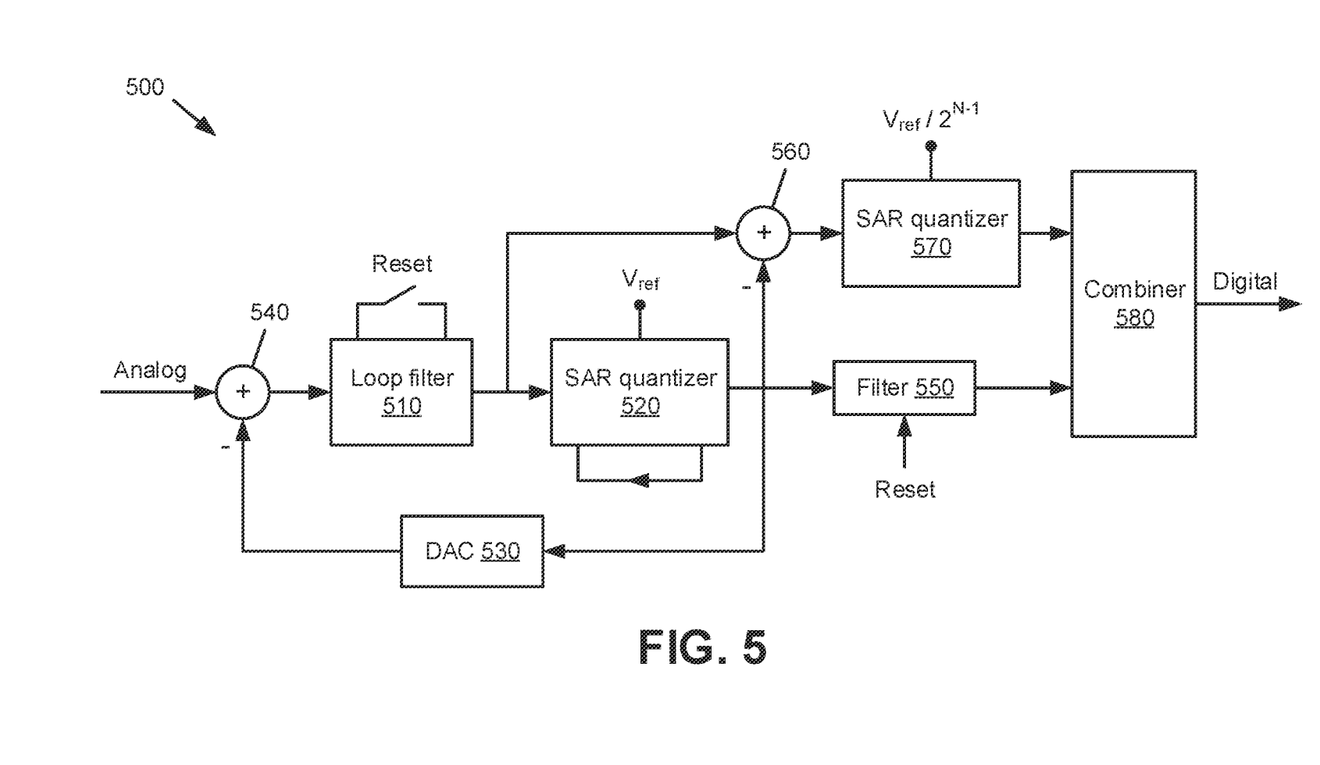
FIG. 5 is a functional block diagram that depicts respective operations performed by the analog to digital conversion circuit of FIG. 3 in accordance with various embodiments of the disclosure.

With reference next to FIG. 5, diagram 500 depicts a functional model of circuit 300 as shown in FIG. 3 and described above. Diagram 500 shows a loop filter 510, a SAR quantizer 520, a DAC 530, and a differential amplifier 540, which can operate as described above with respect to the corresponding loop filter 310, SAR quantizer 320, DAC 330, and differential amplifier 340 of circuit 300 during a first conversion phase, e.g., a first processing step 410 as shown in FIG. 4. As noted above, during the first conversion phase, the SAR quantizer 520 can repeatedly process quantization error, e.g., via noise shaping, to improve the precision of a converted digital output, both with the use of an internal feedback loop (e.g., feedback loop 140 as shown in FIG. 1) and the closed loop including the loop filter 510, the SAR quantizer 520, the DAC 530, and the differential amplifier 540. As used herein, quantization error refers to the difference between the analog input signal and the converted digital output signal.

Following the first conversion phase, diagram 500 further shows that a second conversion phase can be performed by subtracting, at a differential amplifier 560, the residual error from the SAR quantizer 520 associated with the first conversion phase. The resultant output of the differential amplifier 560 can then be provided to an SAR quantizer 570, which processes the amplifier output based on a reference voltage that is smaller than that used in the first conversion phase, e.g., due to the output of the amplifier 560 being smaller than the original analog input signal. Subsequently, the output of the SAR quantizer 570 in the second conversion phase can be combined with the output of the digital filter 550 corresponding to the first conversion phase, resulting in a final digital output.

In diagram 500, the first and second conversion phases are shown with different blocks, e.g., SAR quantizers 520, 570 and differential amplifiers 540, 560, to illustrate functional relationships between the respective functional blocks during the respective phases of the conversion process. It is noted, however, that these functional blocks need not be physically distinct, and that both conversion phases could be performed with a single SAR quantizer and a single differential amplifier, e.g., as shown in FIG. 3.

Figure 6:
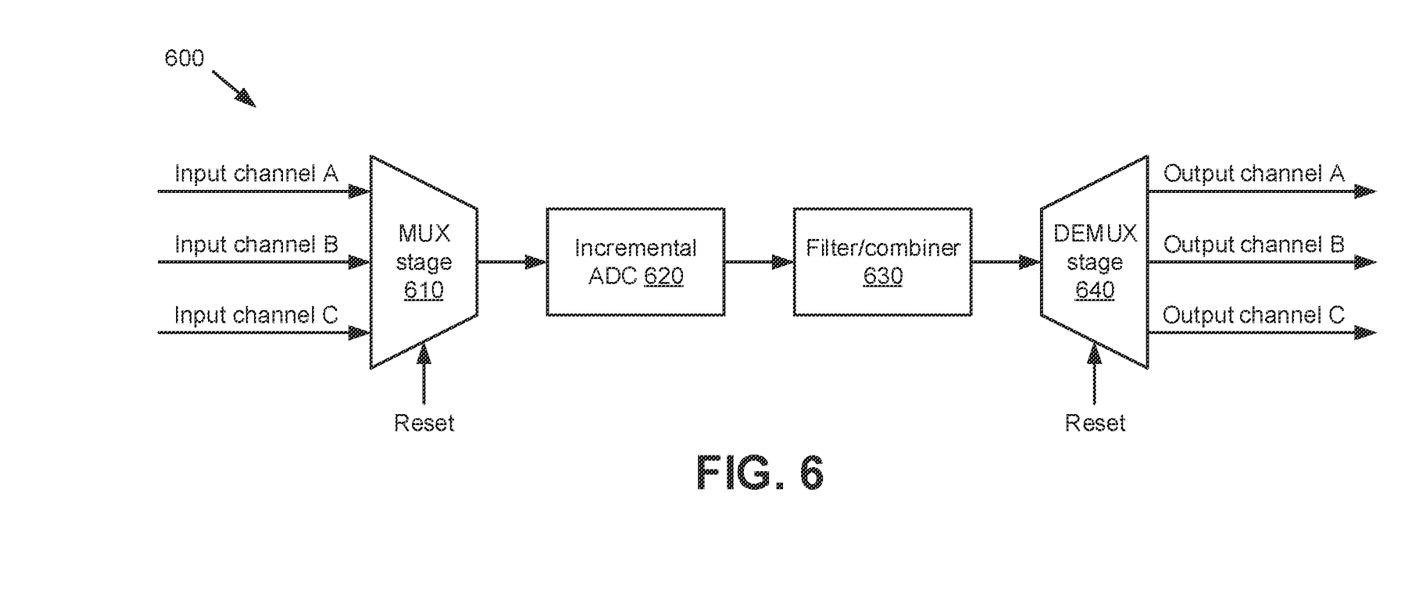
FIGS. 6-7 are block diagrams depicting respective embodiments of a multi-channel multiplexed analog to digital converter in accordance with various embodiments of the disclosure.

With reference now to FIG. 6, a block diagram of a system 600 that facilitates multi-channel multiplexed analog to digital conversion in accordance with various embodiments of the disclosure is provided. Repetitive description of like elements employed in other embodiments described herein is omitted for sake of brevity. System 600 as shown in FIG. 6 includes an incremental ADC 610, which can operate in a similar manner to the incremental ADC 110 described above with respect to FIG. 1, e.g., by incorporating a loop filter 120, an SAR quantizer 130 with a feedback loop 140, and/or other components. For instance, the incremental ADC 610 of system 600 can convert an analog input signal into one or more intermediate digital outputs, which can be further processed by a filter/combiner block 620. In an embodiment, the filter/combiner block 620 can implement some or all of the functionality of the digital filter 150 described above with respect to FIG. 1 and/or a digital signal combiner 210 as described above with respect to FIG. 2 to generate a digitized output signal corresponding to the analog input signal.

In various embodiments, the incremental ADC 610 and the filter/combiner block 620 of system 600 can be shared between multiple analog signal sources, enabling a single ADC circuit to be used for conversion of multiple distinct inputs. Here, a multiplexer (MUX) stage 630 can be used to direct analog input signals from multiple input channels, e.g., input channels associated with different devices, according to a selection sequence or other technique for controlling access to the incremental ADC 610. Similarly, system 600 as shown in FIG. 6 includes a demultiplexer (DEMUX) stage 640, which can direct an output of the filter/combiner block 620 to respective output channels, e.g., output channels associated with the same devices as those corresponding to the input channels and/or other devices. In doing so, the incremental ADC 610 and filter/combiner block 620 of system 600 can be reused for multiple input devices or channels, eliminating the need for multiple ADC circuits and resulting in a reduction to overall circuit size and/or complexity, among other benefits.

While both a multiplexer stage 630 and a demultiplexer stage 640 are shown in FIG. 6, it is noted that various embodiments of an ADC as described herein could include only a multiplexer stage 630 or a demultiplexer stage 640. For instance, the demultiplexer stage 640 could be omitted for a system in which multiple sensor inputs are converted to digital format and provided to a common output display. Other implementations are also possible.

In an embodiment, the multiplexer stage 630 and the demultiplexer stage 640 of system 600 can operate according to a selection sequence, such as a round-robin selection sequence or the like. As further shown in FIG. 6, the multiplexer stage 630 and demultiplexer stage 640 can be coupled to a reset signal for the system, e.g., a reset signal as described above with respect to FIG. 1, to determine when conversion of a given analog signal has completed. Thus, for example, in response to receiving a reset signal, the multiplexer stage 630 can advance a position within the selection sequence, e.g., by decoupling a first input channel (e.g., channel A) from the incremental ADC 610 and coupling a second input channel (e.g., channel B) to the incremental ADC. The demultiplexer stage 640 can operate in a similar manner to the multiplexer stage, e.g., by decoupling a first output channel in a selection sequence from an output of the filter/combiner block 620 and coupling a second output channel in the selection sequence to the output of the filter/combiner block 620 in response to receiving the reset signal. Other techniques for selecting input and/or output channels could be used, such as by providing a binary selection signal to the multiplexer stage 630 and/or the demultiplexer stage 640.

Figure 7:
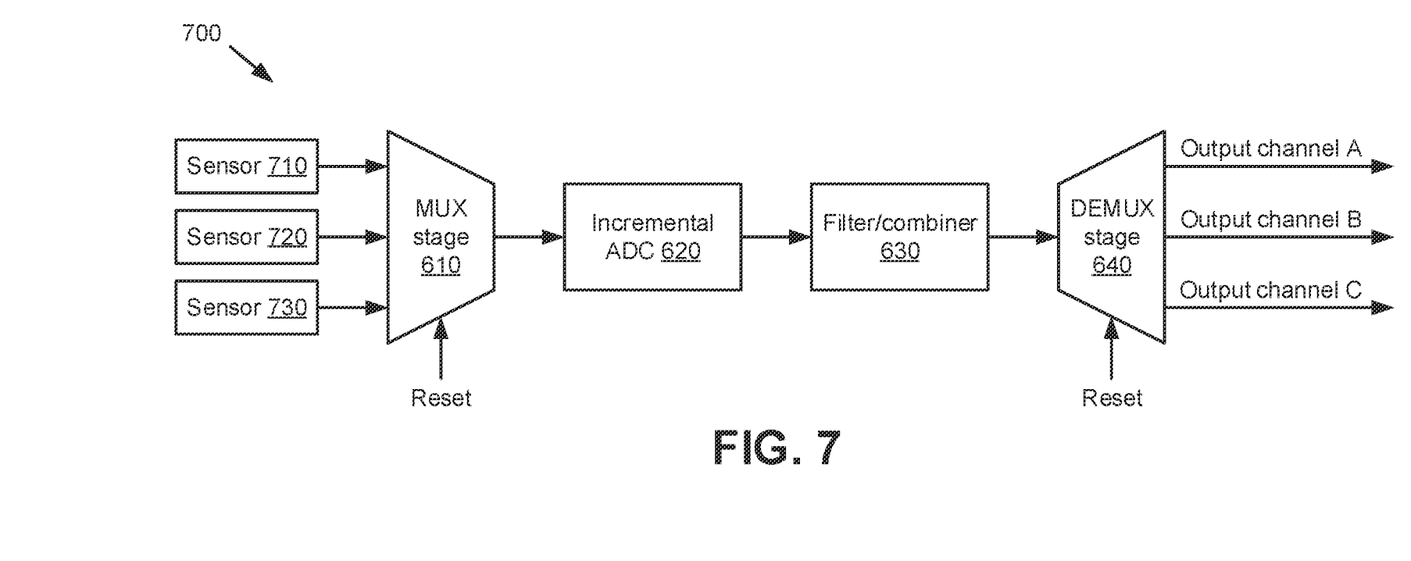

Referring next to FIG. 7, a block diagram of another system 700 that facilitates multi-channel multiplexed analog to digital conversion in accordance with various embodiments of the disclosure is provided. Repetitive description of like elements employed in other embodiments described herein is omitted for sake of brevity. System 700 can operate in a similar manner to system 600 as described above, with the addition of respective sensors 710, 720, 730 coupled to the respective input channels of the multiplexer stage 630. In an embodiment, respective analog outputs of the sensors 710, 720, 730 can be converted in sequence, e.g., according to a round robin sequence or the like, and provided to respective digital output channels corresponding to the respective sensors 710, 720, 730, respective displays or other output devices associated with the sensors 710, 720, 730, and/or other suitable output devices.

Similar to system 600 as described above, the multiplexer stage 630 and demultiplexer stage 640 of system 700 can operate based on a reset signal provided to the system 700, e.g., such that the input and output channels coupled to the incremental ADC 610 and the filter/combiner block 620 are rotated in response to conversion of a given input signal being completed. Other implementations are also possible. For instance, the multiplexer stage 630 and demultiplexer stage 640 could facilitate asynchronous conversion, e.g., based on which of the sensors 710, 720, 730 are currently in use. For instance, each of the sensors 710, 720, 730 could provide an input signal to the multiplexer stage 630 and the demultiplexer stage 640 in response to the sensor devices 710, 720, 730 performing measurements. In the event that multiple sensors 710, 720, 730 are used simultaneously, the multiplexer stage 630 and demultiplexer stage 640 could rotate between the sensors 710, 720, 730 according to a selection sequence, e.g., as described above.

Figure 8:
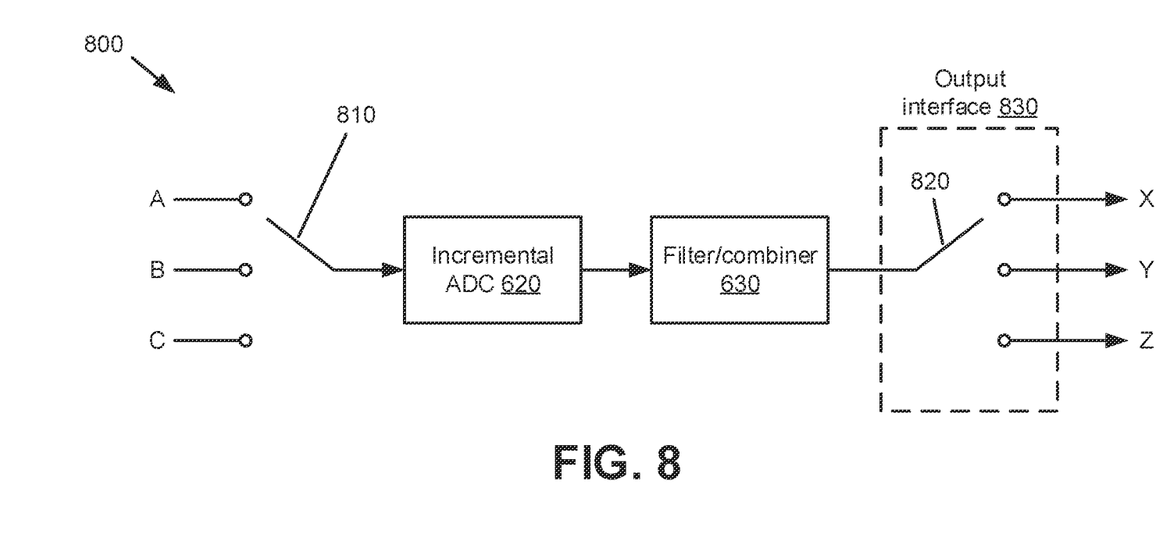
FIG. 8 is a block diagram of a system that facilitates round robin digitization of respective analog signals in accordance with various embodiments of the disclosure.

Turning now to FIG. 8, a block diagram of a system 800 that facilitates round robin digitization of respective analog signals in accordance with various embodiments of the disclosure is provided. Repetitive description of like elements employed in other embodiments described herein is omitted for sake of brevity. System 800 as shown in FIG. 8 includes an incremental ADC 610 and a filter/combiner block 620 that can operate as described above with respect to FIGS. 6-7.

Similar to system 600 as shown in FIG. 6, system 800 can facilitate sharing of the incremental ADC 610 and filter/combiner block 620 among multiple input channels, shown in FIG. 8 as channels A-C, and multiple output channels, shown in FIG. 8 as channels X-Z. In an embodiment as shown by FIG. 8, selection between input and output channels can be performed via respective rotary switches, including a first rotary switch 810 that sequentially couples respective input channels to an input of the incremental ADC 610 and a second rotary switch 820 that sequentially couples an output of the filter/combiner block 620 to respective output channels, e.g., output channels associated with a common output interface 830.

Similar to the multiplexer stage 630 and demultiplexer stage 640 of systems 600 and 700 as described above, the rotary switches 810, 820 can sequentially couple respective input and output channels to a common converter, e.g., a converter implemented by the incremental ADC 610 and the filter/combiner block 620, based on a round-robin selection sequence and/or another suitable sequence. By way of example, the rotary switches 810, 820 can be coupled to and/or otherwise controlled by a reset signal associated with 800 such that the rotary switches 810, 820 are configured to advance a position within the round-robin selection sequence in response to receiving a reset pulse associated with the reset signal. Other implementations could also be used.

Figure 9:
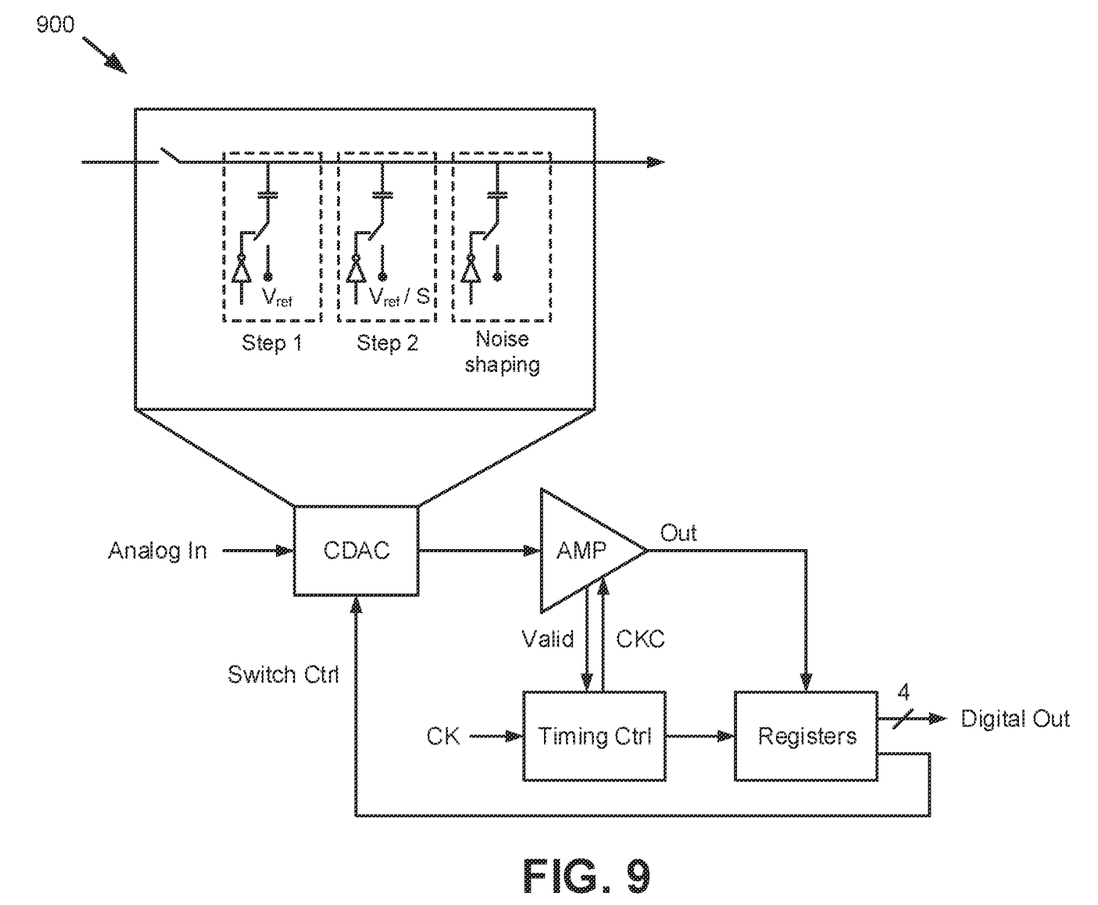
FIG. 9 is a circuit diagram depicting an example two-step noise shaping successive approximation register that can be utilized by various embodiments of the disclosure.

Referring next to FIG. 9, a diagram 900 depicting an example two-step noise shaping SAR that can be utilized by various embodiments of the disclosure is presented. It is noted that the SAR shown in FIG. 9 is merely one example of an implementation of an SAR that could be used and that other implementations are also possible. The SAR shown by diagram 900 utilizes respective registers, which can store digital data and perform successive approximation to match an analog input to a sequence of digital bits, e.g., using a binary search technique. As further shown in diagram 900, the SAR includes a loop from the registers to a capacitive DAC (CDAC) that converts a digital estimation of an analog input as produced by the registers back to an analog format, which can be subtracted from the original analog input via an amplifier (AMP). In an embodiment, the SAR can perform multiple loop iterations in this manner to generate a digital word corresponding to the analog input.

As further shown in diagram 900, the CDAC includes subcircuits for each conversion phase, e.g., the first processing step 410 and the second processing step 420 shown in FIG. 4, as well as a separate subcircuit for noise shaping. In the first conversion phase, the CDAC can utilize a first subcircuit, shown as "Step 1" in diagram 900, in which a first reference voltage $V_{ref}$ is applied to a first set of capacitors. Additionally, the CDAC can utilize the noise shaping subcircuit during the first conversion phase. In the second conversion phase, the CDAC can utilize a second subcircuit, shown as "Step 2" in diagram 900, in which a second, lower reference voltage $V_{ref}/S$ (for a given value of S) is applied to a second, distinct set of capacitors. By incorporating multiple subcircuits as shown in diagram 900, the SAR can be reused for each phase of the conversion process described herein.

Referring back to circuit 100 in FIG. 1, the digital filter 150 can filter the intermediate output of the incremental ADC 110 based on a transfer function, which in turn can be based on a specified noise shaping factor. In one example, the transfer function of the digital filter 150 can be expressed as follows:

$$H(z) = \left(\frac{1}{1-z^{-1}}\right)^2 \left(\frac{1}{1-kz^{-1}}\right)$$

where k is the noise shaping factor and k is less than 1.

Also or alternatively, the output of the digital filter 150 can be scaled according to a scaling factor, which can be based on the step response of a function S(z). In one example, function S(z) can be based on the noise shaping factor k as follows:

$$S(z) = (-1.5 + 0.5z^{-1})\left(\frac{1}{1-z^{-1}}\right)^2 \left(\frac{1}{1-kz^{-1}}\right)$$

With respect to the above transfer functions, it is noted that the examples provided are intended merely as examples of transfer functions that could be utilized, and that other transfer functions are also possible.

Figure 10:
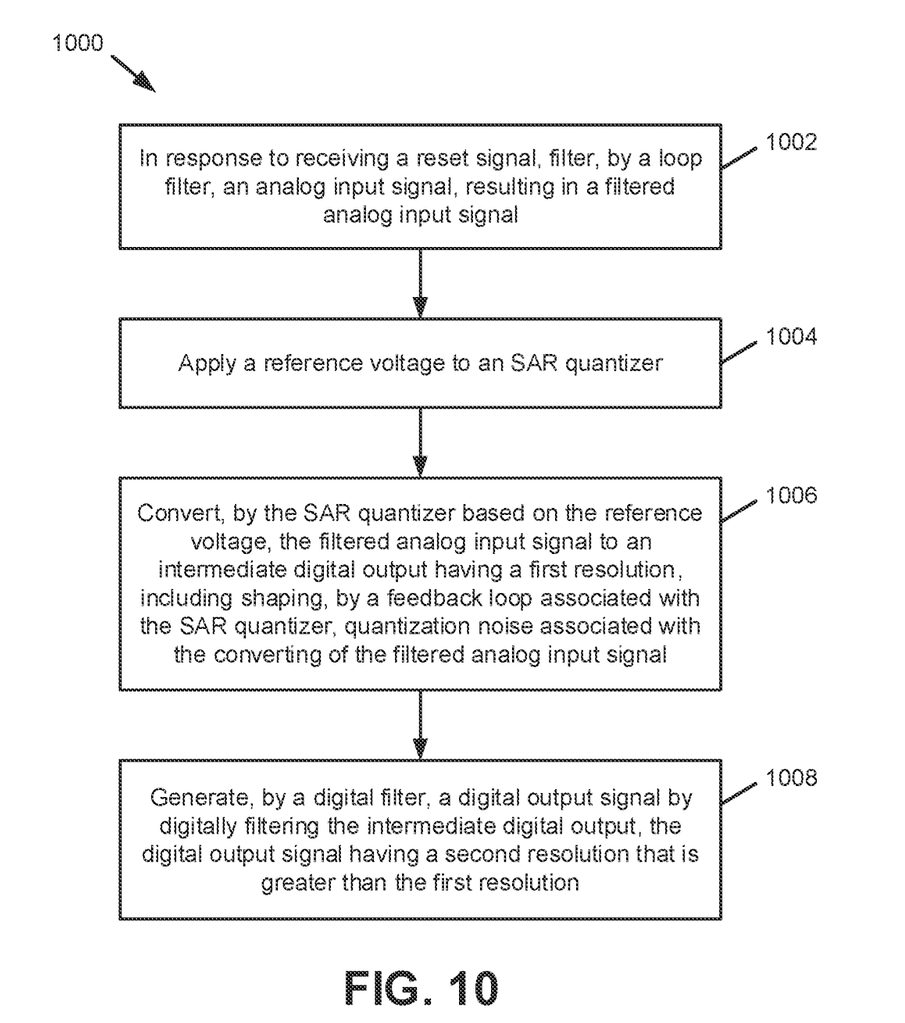
FIG. 10 is a flow diagram of a method for analog to digital conversion incorporating noise shaping and residual error quantization in accordance with various embodiments of the disclosure.

FIG. 10 presents a flow diagram of an example method 1000 for analog to digital conversion incorporating noise shaping and residual error quantization in accordance with various embodiments of the disclosure. At 1002, in response to receiving a reset signal (e.g., at an incremental ADC 110), a loop filter (e.g., a loop filter 120) can filter an analog input signal, resulting in a filtered analog input signal.

At 1004, a reference voltage can be applied to an SAR quantizer (e.g., an SAR quantizer 130). Next, at 1006, the SAR quantizer can convert, based on the reference voltage applied at 1004, the filtered analog input signal into an intermediate digital output having a first resolution. The conversion at 1006 can include shaping, by a feedback loop (e.g., a feedback loop 140) associated with the SAR quantizer, quantization noise associated with converting the filtered analog input signal.

At 1008, a digital filter (e.g., a digital filter 150) can generate a digital output signal by digitally filtering the intermediate digital output. The digital output signal generated at 1008 can have a second resolution that is higher than the first resolution associated with the intermediate digital output at 1006.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, in the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A circuit, comprising:
   an incremental analog to digital converter, comprising:
      a loop filter that filters an analog input signal in response to receiving a reset signal, resulting in a filtered analog input signal; and
      a successive approximation register (SAR) quantizer, coupled with the filtered analog input signal, that converts the filtered analog input signal to a first intermediate digitized output based on a first reference voltage, wherein the SAR quantizer comprises a feedback loop that shapes quantization noise generated by the SAR quantizer as a result of converting the filtered analog input signal, and wherein the first intermediate digitized output has a first resolution;
   a digital to analog converter, coupled with the first intermediate digitized output, that converts the first intermediate digitized output to a converted analog signal;
   a differential amplifier that subtracts the converted analog signal from the analog input signal, resulting in a residual analog input signal, wherein the SAR quantizer converts the residual analog input signal to a second intermediate digitized output based on a second reference voltage that is lower than the first reference voltage; and
   a digital filter, coupled with the first intermediate digitized output, that generates a digitized output signal by digitally filtering the first intermediate digitized output, wherein the digitized output signal has a second resolution that is greater than the first resolution.

2. The circuit of claim 1, wherein the digitized output signal is a first digitized output signal, and wherein the circuit further comprises:
   a digital output combiner that sums the second intermediate digitized output and the first digitized output signal, resulting in a second digitized output.

3. The circuit of claim 2, further comprising:
   a first rotary switch that sequentially couples respective analog input channels to the incremental analog to digital converter, resulting in a stream of analog input signals, comprising the analog input signal; and
   a second rotary switch that sequentially couples the second digitized output to respective digital output channels.

4. The circuit of claim 3, wherein the first rotary switch sequentially couples the respective analog input channels to the incremental analog to digital converter according to a round-robin selection sequence, wherein the second rotary switch sequentially couples the second digitized output to the respective digital output channels according to the round-robin selection sequence, and wherein the first rotary switch and the second rotary switch are configured to advance a position within the round-robin selection sequence in response to receiving the reset signal.

5. The circuit of claim 3, wherein the respective analog input channels correspond to respective analog sensor outputs.

6. The circuit of claim 1, wherein the SAR quantizer is further electrically coupled to a clock signal, and wherein the SAR quantizer converts the filtered analog input signal to the first intermediate digitized output during a time interval equal to a defined number of cycles of the clock signal.

7. The circuit of claim 6, wherein the second reference voltage is reduced by an amount based on the defined number of cycles of the clock signal, relative to the first reference voltage.

8. The circuit of claim 1, wherein the loop filter, the SAR quantizer, the digital to analog converter, and the differential amplifier are electrically coupled in a closed loop configuration.

9. The circuit of claim 1, wherein the loop filter comprises a resistor-capacitor network.

10. The circuit of claim 1, wherein the loop filter comprises a switched capacitor.

11. A method, comprising:
    in response to receiving a reset signal, filtering, by a loop filter, an analog input signal, resulting in a filtered analog input signal;
    applying a first reference voltage to a successive approximation register (SAR) quantizer;
    converting, by the SAR quantizer based on the first reference voltage, the filtered analog input signal to a first intermediate digital output, wherein the converting of the filtered analog input signal comprises shaping, by a feedback loop associated with the SAR quantizer, quantization noise associated with the converting of the filtered analog input signal, and wherein the first intermediate digital output has a first resolution;
    generating, by a digital filter, a digital output signal by digitally filtering the first intermediate digital output, wherein the digital output signal has a second resolution that is greater than the first resolution;
    converting, by a digital to analog converter, the first intermediate digital output to a converted analog signal;
    subtracting, by a differential amplifier, the converted analog signal from the analog input signal, resulting in a residual analog input signal;
    applying a second reference voltage to the SAR quantizer instead of the first reference voltage in response to the subtracting, wherein the second reference voltage is lower than the first reference voltage; and
    converting, by the SAR quantizer based on the second reference voltage, the residual analog input signal to a second intermediate digital output.

12. The method of claim 11, wherein the digital output signal is a first digital output signal, and wherein the method further comprises:
    combining the second intermediate digital output and the first digital output signal, resulting in a second digital output signal.

13. The method of claim 12, further comprising:
    selecting, as the analog input signal, respective ones of a plurality of analog input signals according to a selection sequence; and coupling the second digital output signal to respective ones of a plurality of digital output channels according to the selection sequence.

14. The method of claim 13, further comprising:
advancing a position within the selection sequence in response to receiving the reset signal.

15. The method of claim 11, wherein the converting of the filtered analog input signal comprises converting the filtered analog input signal to the first intermediate digital output during a time interval equal to a defined number of clock signal cycles.

16. The method of claim 15, wherein the second reference voltage is reduced relative to the first reference voltage by an amount based on the defined number of the clock signal cycles.

17. The method of claim 16, wherein the second reference voltage is equal to the first reference voltage divided by $2^{N-1}$, where N is the defined number of the clock signal cycles.

18. The circuit of claim 6, wherein the second reference voltage is equal to the first reference voltage divided by $2^{N-1}$, where N is the defined number of cycles of the clock signal.

19. The method of claim 11, further comprising:
selecting the analog input signal from a plurality of analog input signals according to a binary selection signal.

20. The method of claim 19, wherein the plurality of analog input signals comprise output signals of respective ones of a plurality of analog sensors.

* * * * *